US010996722B2

(12) United States Patent
Ho et al.

(10) Patent No.: US 10,996,722 B2
(45) Date of Patent: May 4, 2021

(54) ADAPTIVE HEAT DISSIPATION FRAME

(71) Applicant: Microsoft Technology Licensing, LLC, Redmond, WA (US)

(72) Inventors: Chau Van Ho, Des Moines, WA (US); Timothy M. Sullivan, Woodinville, WA (US); Avinash Raghuram, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/433,579

(22) Filed: Jun. 6, 2019

(65) Prior Publication Data

US 2020/0387202 A1    Dec. 10, 2020

(51) Int. Cl.
| | |
|---|---|
| *G06F 1/02* | (2006.01) |
| *G06F 1/20* | (2006.01) |
| *G05B 15/02* | (2006.01) |
| *G06F 1/16* | (2006.01) |
| *H05K 7/20* | (2006.01) |

(52) U.S. Cl.
CPC ............. *G06F 1/206* (2013.01); *G05B 15/02* (2013.01); *G06F 1/1643* (2013.01); *G06F 1/203* (2013.01); *H05K 7/20254* (2013.01); *H05K 7/20272* (2013.01); *H05K 7/20281* (2013.01); *G06F 1/1626* (2013.01); *G06F 2200/201* (2013.01)

(58) Field of Classification Search
CPC ......... G06F 1/206; G06F 1/203; G06F 1/1643
See application file for complete search history.

(56) References Cited

U.S. PATENT DOCUMENTS

| | | | |
|---|---|---|---|
| 9,291,399 B2 * | 3/2016 | Barnes ................. | G06F 1/206 |
| 2017/0364130 A1 * | 12/2017 | Ho ........................ | G06F 1/3243 |
| 2017/0371386 A1 * | 12/2017 | Breslow ............... | G05D 7/0676 |
| 2018/0150116 A1 * | 5/2018 | Yuan ..................... | G06F 1/206 |
| 2018/0177037 A1 * | 6/2018 | Koller ................. | H05K 7/20218 |
| 2018/0267578 A1 * | 9/2018 | Ho ........................ | G06F 1/1681 |
| 2019/0141854 A1 * | 5/2019 | Ku ..................... | H05K 7/20336 |

FOREIGN PATENT DOCUMENTS

| | | |
|---|---|---|
| CN | 105824378 A | 8/2016 |
| CN | 205454359 U | 8/2016 |

OTHER PUBLICATIONS

"International Search Report and Written Opinion Issued in PCT Application No. PCT/US2020/029039", dated Jun. 29, 2020, 12 Pages.

* cited by examiner

*Primary Examiner* — Mukundbhai G Patel
(74) *Attorney, Agent, or Firm* — Rainier Patents, P.S.

(57) ABSTRACT

This document relates to providing a thermal management system for a device. One example determines temperature readings associated with one or more components of the device, and comparing the temperature readings to optimal operating temperatures. This example can selectively couple or decouple heat-dissipating elements based at least on the temperature readings associated with the one or more components of the device in order to reach the optimal operating temperatures.

17 Claims, 5 Drawing Sheets

| PM Power | TDM Power | Ambient Temp | Upper Beam Temp | Lower Beam Temp | PM Temp | TDM Temp | Gate Action | Expected Outcome |
|---|---|---|---|---|---|---|---|---|
| 5 | 1 | 25 | 55 | 52 | 75 | 50 | Engaged | Reduce Processor Power |
| 5 | 1 | 25 | 57 | 49 | 76 | 48 | Disengaged | Processor Power Constant |
| 2 | 3 | 35 | 50 | 53 | 60 | 49 | Disengaged | Reduce Brightness |
| 2 | 3 | 35 | 52 | 50 | 60 | 48 | Engaged | Maintain Brightness |

ADAPTIVE HEAT DISSIPATION FRAME

BACKGROUND

The increased use of mobile devices throughout the world has spurred greater advancement in efforts to increase processing capabilities associated with the mobile devices. At the same time, ease of carrying such mobile devices is of extreme importance, and therefore mobile devices have become thinner and more convenient to carry. Due to the thinness of modern mobile devices, heat dissipation can be difficult, especially due to the increase in processing capabilities of the mobile devices and the lack of available room to sufficiently provide heat sinks for processing elements. Therefore, heat can often accumulate in the mobile device, which can lead to a deterioration of components and a reduction in overall efficiency for the mobile device.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

The description generally relates to techniques for heat dissipation in a device. One example is directed to a device that includes a processing unit, a touch-sensitive display surface, a first heat-dissipating element coupled to the processing unit, a second heat-dissipating element coupled to the touch-sensitive display surface, and a heat-conducting element selectively coupled between the first heat-dissipating element and the second heat-dissipating element, the heat-conducting element can be positioned to allow or restrict heat to flow between the first heat-dissipating element and second dissipating element based at least on temperature readings associated with the processing unit and the touch-sensitive display surface.

Another example is directed to an alternate device, which may include a plurality of heat-generating electronic components, a heat-conducting system dispersed throughout the device to carry heat away from the heat-generating electronic components, and one or more gates dispersed throughout the heat-conducting system that can be selectively engaged to allow heat conduction between elements of the heat-conducting system, or disengaged to restrict heat conduction between the elements of the heat-conduction system, based at least on temperature readings associated with the heat-generating electronic components.

Another example includes a method or technique that can be performed on a device. The method can include determining temperature readings associated with at least one of a touch-sensitive display or a processing unit, comparing the determined temperature readings to an optimal operating temperature, and selectively coupling or decoupling a first heat-dissipating element associated with the touch-sensitive display from a second heat-dissipating element associated with the processing unit based at least on whether the determined temperature exceeds the optimal operating temperature.

The above listed examples are intended to provide a quick reference to aid the reader and are not intended to define the scope of the concepts described herein.

BRIEF DESCRIPTION OF THE DRAWINGS

The Detailed Description is described with reference to the accompanying figures. In the figures, the left-most digit(s) of a reference number identifies the figure in which the reference number first appears. The use of similar reference numbers in different instances in the description and the figures may indicate similar or identical items.

DETAILED DESCRIPTION

Overview

The present concepts relate to heat dissipation in devices, such as mobile devices, where device thinness is of importance to consumers. Due to the thinness of such devices, heat generated by components of the device can adversely affect performance of the device, and lead to unfavorable user experiences with the device. The concepts discussed herein therefore discuss methods of heat dissipation and efficient heat management in these types of devices.

Figure 1A:
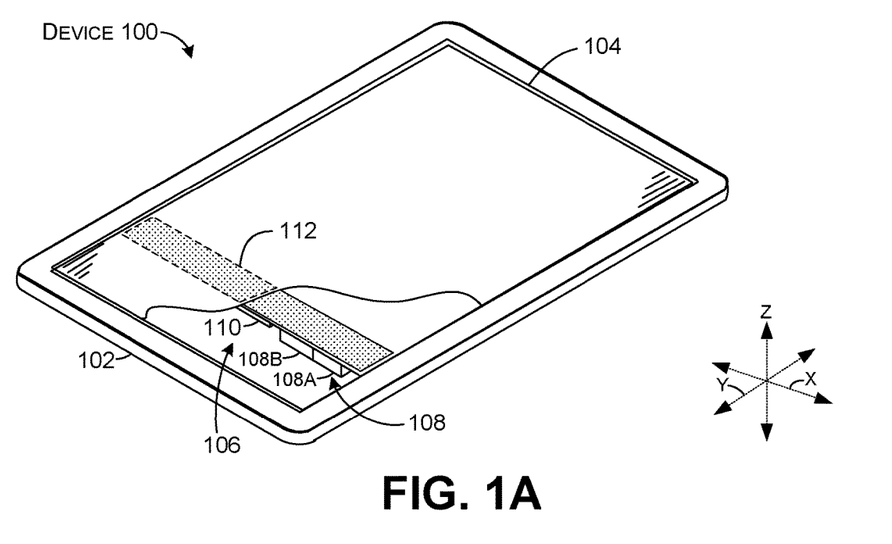
FIGS. 1A-1E illustrate example devices that are consistent with some implementations of the present concepts.

FIGS. 1A-1E show an example device 100 manifest as a tablet style computing device. FIG. 1A shows a partial cut-away view of device 100, while FIGS. 1B-1E depict various sectional views of device 100. As shown in FIG. 1A, device 100 can have a device housing 102, which may cover a back of device 100 and/or sides of device 100. A display 104 may also be included with device 100, for displaying information or receiving input. Device 100 may also include a set of heat-generating electronic components 106. In this example, heat-generating electronic components 106 may include a processing module 108, which may include various electronic processing components, such as a processor 108A and a memory 108B.

Device 100 may further include a touch display module 110 associated with display 104. Device 100 can further include a heat-conducting system 112 that can be dispersed throughout device 100 and can be used to dissipate heat generated by heat-generating electronic components 106. While FIG. 1A depicts processing module 108 and touch display module 110 positioned on a similar x reference axis, in some implementations, the set of heat-generating electronic components 106 can be positioned along the z reference axis in a sandwiched fashion between device housing 102 and display 104, as depicted in FIG. 1B.

Figure 1B:
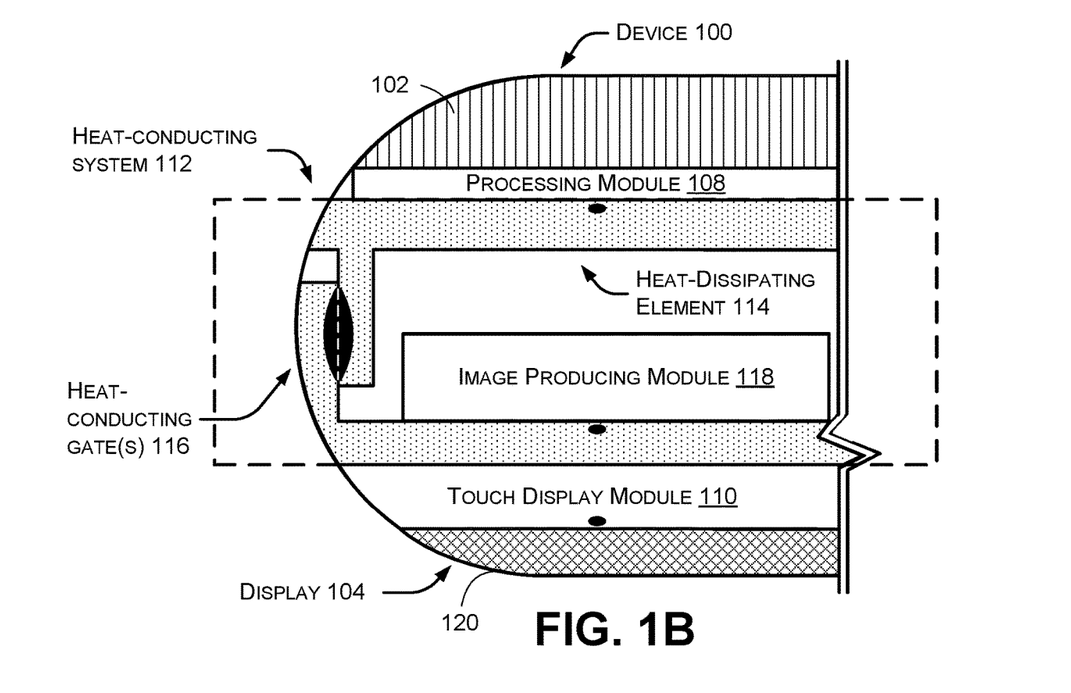

FIG. 1B depicts a cross-section of a portion of an example device 100 including heat-conducting system 112 according to one implementation. As depicted, device 100 may include device housing 102, which may be a glass backing or other such material covering the back of the device. Device 100 may also include processing module 108, which may be a system on a chip (SOC) printed circuit board assembly having a number of hardware electronic components attached and/or soldered to the printed circuit board. Such electronic components may include a central processing unit (CPU) such as processor 108A, a graphic processing unit (GPU), a memory, such as memory 108B (e.g., flash memory), and other electronic components (such as capacitors, resistors, transistors or IC chips).

Processing module 108 may also execute various subsystems that operate on device 100 and may be stored in the memory of the SOC, such as a memory management system, which can be used to handle allocation of memory resources. Processing module 108 may also store and execute a thermal management system, which may be used to optimize device performance while keeping device 100 within safe operating temperatures.

Figure 1C:
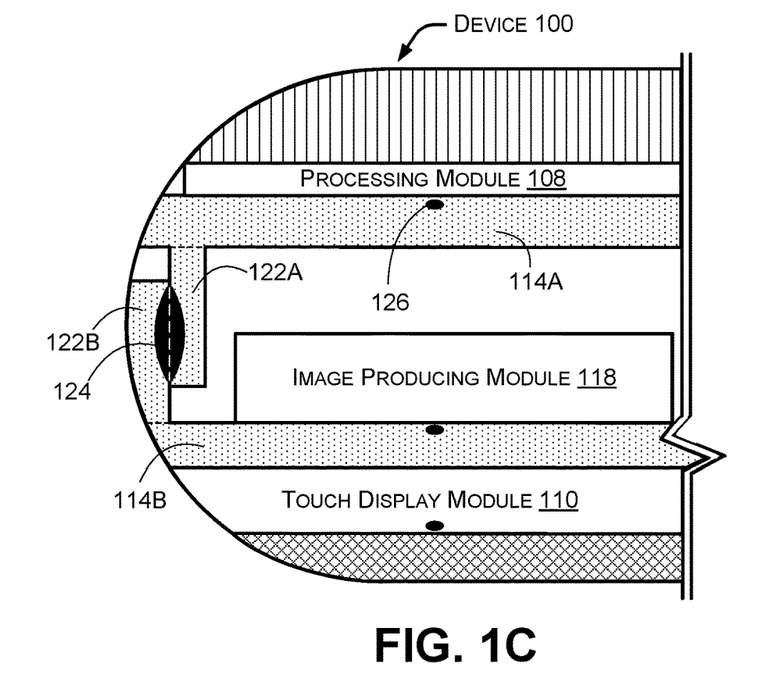

Heat-conducting system 112 of device 100 may include an internal heat-dissipating element 114 that can be used for dissipation of heat throughout the device by way of heat-conduction. Heat-dissipating element 114 can be a structural element that may make contact with various components of device 100, such as processing module 108, in order to dissipate heat generated from the components. For example, heat-dissipating element 114 can be a structural element disposed within device 100, such as a metallic mid-frame, that serves as a heat spreader. In certain implementations, heat-dissipating element 114 may be alternative types of heat spreaders, such as pieces of metal or graphite, graphite sheets, heat pipes, vapor chambers, or any other such element that can serve as a heat spreader throughout device 100. Furthermore, heat-dissipating element 114 may be divided into multiple sections by way of heat-conducting gate(s) 116, which can be selectively engaged or disengaged to direct heat flow throughout device 100, described in greater detail with reference to FIG. 10.

Device 100 may also include an image producing module 118, which can be an electronic component used for generating images to be displayed by device 100. In some implementations, image producing module 118 may be a liquid crystal display (LCD), a light-emitting diode (LED) display, an organic light emitting diode (OLED) display, or another other type of light-emitting structure that can be used to generate images.

Device 100 may also include display 104, which may collectively be made up of touch display module 110 and a protective surface 120. Touch display module 110 can display images produced from image producing module 118, such as images depicting a graphical user interface (GUI) that can enable a user to interact with device 100 through simple or multi-touch gestures by touch, or via a stylus or pen. Protective surface 120 can be disposed on the surface of touch display module 110, which can provide protection for touch display module 110 from scratching, dirt, or other particulates. In some implementations, protective surface 120 may be a thin sheet of transparent glass, or may be a transparent scratch-resistant membrane. However, in certain implementations, protective surface 120 may be integrated as one layer with touch display module 110, such as by having a glass covering over the top surface of touch display module 110.

Heat-conducting system 112 of device 100 is described in greater detail in FIG. 10. As depicted in FIG. 10, heat-dissipating element 114 can made up of an upper beam 114A, and a lower beam 114B. Heat-conducting gate(s) 116 can be an assembly that may be made up of heat-conducting elements 122A and 122B and a positioning element 124. Heat-conducting element 122A can be thermally coupled to upper beam 114A and heat-conducting element 122B can be thermally coupled to lower beam 114B. In one example, heat-conducting elements 122A and 122B may be a solid conducting material, such as metallic bars that extend toward the opposing beam of the frame, and in some instances, may be formed as an integrated part of their respective beams.

Positioning element 124 can be selectively engaged to thermally couple heat-conducting elements 122A and 122B, thereby permitting heat to flow, or selectively disengaged to thermally decouple heat-conducting elements 122A and 122B, isolating heat to a particular area of heat-dissipating element 114. Specifically, positioning element 124, when activated by the thermal management system, can cause heat-conducting element 122A to contact heat-conducting element 122B, providing a heat-conduction path between upper beam 114A and lower beam 114B. Contact can be made, for example, by bending each of heat-conducting elements 122A and 122B slightly into contact by magnetic force. Alternatively, one or more parts of heat-dissipating element 114 or heat-conducting gate(s) 116 may be slidably movable, such as by being on a track, and upon activation of positioning element 124, the one or more parts of heat-dissipating element 114 and/or heat-conducting gate(s) 116 may slide into contact to allow heat to flow.

Positioning element 124 can be any type of positioning element that is capable of coupling or decoupling one or more portions of heat-dissipating element 114 to allow for thermal movement. For example, positioning element 124 may be an electromagnet, a hinge, a motor, or a sliding mechanism that may move heat-conducting elements 122A and 122B into contact. Alternatively, positioning element 124 may position an object that allows for heat conduction between heat-conducting elements 122A and 122B. For example, positioning element 124 can be a heat pipe or vapor chamber, which can be capable of conducting heat between heat-conducting elements 122A and 122B when engaged, or may prevent heat flow when disengaged.

Engagement and disengagement of heat-conducting gate(s) 116 may be determined by the thermal management system in response to, for example, temperature readings from one or more thermal sensors 126, which may be placed at various points of device 100. As depicted in FIG. 10, thermal sensors may be placed on upper beam 114A, lower beam 114B, and/or on touch display module 110, in order to accurately represent temperature readings associated with these components to the thermal management system. Specific steps performed by the thermal management system in engaging and disengaging heat-conducting gate(s) based at least on thermal temperature readings will be referenced below with respect to FIGS. 2 and 3.

Figure 1D:
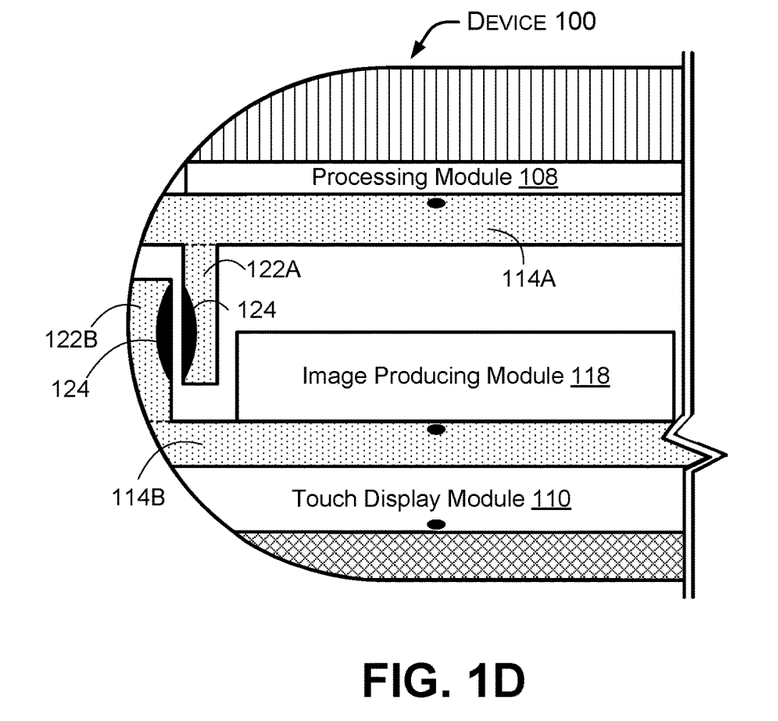

FIG. 1D depicts an example of heat-conducting gate(s) 116 in the disengaged position, which can occur based on instructions by the thermal management system. In this example, the thermal management system wants to isolate heat to a certain area of device 100, and therefore, heat-conducting gate(s) 116 is disengaged to stop a heat flow path between upper beam 114A and lower beam 114B. Specifically, in response to instructions from the thermal management system, positioning element 124 (depicted as an electromagnet) may be disengaged, which may cause heat-conducting elements 122A and 122B to move away from each other such that the elements are no longer in contact. For example, as positioning element 124 may be an electromagnet, the polarity of the magnet can be changed to repel heat-conducting elements 122A and 122B from each other and isolating heat to their respective beams. As depicted in FIG. 1D, positioning element 124 may be included as a part of both heat-conducting elements 122A and 122B (i.e., both elements may have an electromagnet), or in some implementations, positioning element 124 may be included with only one of the heat-conducting elements.

As such, heat-conducting gate(s) 116, made up of heat-conducting elements 122A, 122B, and positioning element 124, can serve as a thermal gate that can be opened or closed based on instructions from, for example, the thermal management system. The thermal management system may engage or disengage the thermal gate in response to temperature readings provided by thermal sensors 126, such as in response to comparing current temperature readings to optimal operating temperatures for components, which may be stored, for example, in a thermal lookup table in memory. Specific steps performed by the thermal management system in engaging and disengaging the thermal gate will be referenced below with respect to FIGS. 2 and 3.

Alternative Implementation

Figure 1E:
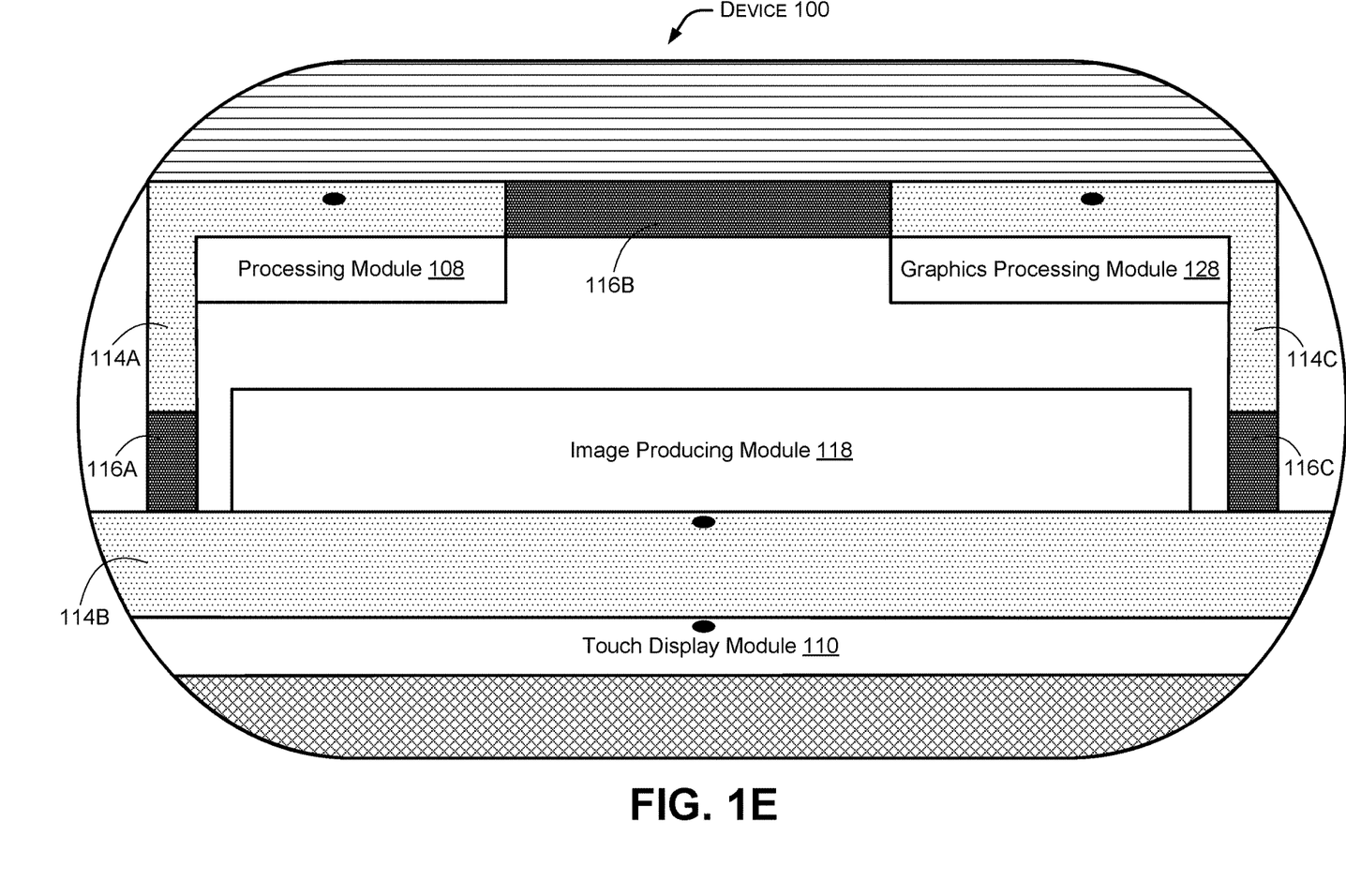

FIG. 1E depicts an alternative implementation of device 100. In this implementation, device 100 may include a dedicated graphics processing module 128, in addition to processing module 108, image producing module 118, and touch display module 110. The graphics processing module 128 may be, for example, a graphics processing unit (GPU) that can allow device 100 to more efficiently handle computer graphics and image processing, thereby alleviating processing requirements on processing module 108. In this instance, graphics processing module 128 can also generate a large amount of heat in the interior of device 100, which may adversely impact overall operating performance of device 100.

As such, in this implementation, heat-dissipating element 114 may comprise multiple subsections, such as upper beam 114A, lower beam 114B, and secondary upper beam 114C. Furthermore, there may be a plurality of heat-conducting gate(s) 116A, 116B, and 116C disposed within the interior of device 100, which can be used to divert heat flow around device 100 in multiple different ways depending on processing load of the components. In this example, heat-conducing gate(s) 116A, 116B, and 116C may use a vapor chamber as a heat-conducting element. In this implementation, the thermal management system can determine whether a vapor chamber can be engaged to allow heat to conduct through the chamber, such as by filling the chamber with a working heat-conducting fluid by way of a pump to enable heat to conduct through the chamber. Alternatively, fluid in a chamber can be reduced, creating a vacuum in the chamber, which can reduce heat transfer capability to a minimum.

For example, based on the implementation depicted in FIG. 1E, certain heat-conducting gates can be selectively engaged or disengaged according to commands from the thermal management system. For example, processing module 108 and graphics processing module 128 may be generating excessive heat. In this instance, the thermal management system can compare temperatures of processing module 108 and graphics processing module 128 with optimal temperature specifications, and can then determine an optimal action for handling the excessive heat by way of using the heat-conducting gates.

For example, if processing module 108 is producing excessive heat, but graphics processing module 128 has a temperature that is below the specification temperature (and thus has additional capacity to absorb heat), heat-conducting gates 116A and 116C may be disengaged to restrict heat flow into lower beam 114B from both upper beam 114A and secondary upper beam 114C, in an effort to avoid overheating touch display module 110. However, heat-conducting gate 116B may be engaged in an attempt to spread heat between upper beam 114A and secondary upper beam 114C, providing extra heat-spreading capacity. Alternatively, in instances of high GPU computational requirements, graphics processing module 128 may be isolated from adversely affecting operation of processing module 108 or touch display module 110 by disengaging heat-conducting gates 116B and 116C, thereby preventing excessive heat from flowing to the rest of the components in device 100.

While FIG. 1E depicts three subsections to heat-dissipating element 114, and three heat-conducting gate(s) 116, it is to be appreciated that any number of elements and/or gates can be used to allow a greater amount of granular control over heat flow in device 100. For example, lower beam 114B may be further subdivided into a plurality of subsections with heat-conducting gates dispersed throughout the subsections.

It is to be further appreciated that the examples provided of the heat-conducting system depicted in FIGS. 1A-1E are not the only implementations contemplated, and other types of heat-conducing assemblies can be used. For example, a mechanical hinge can be used with a motor to pivot a heat-conducting bar toward and away from the upper and lower beams of the heat-conducting system based upon instruction by the thermal management system.

Example Heat-Dissipation Method

Figure 2:
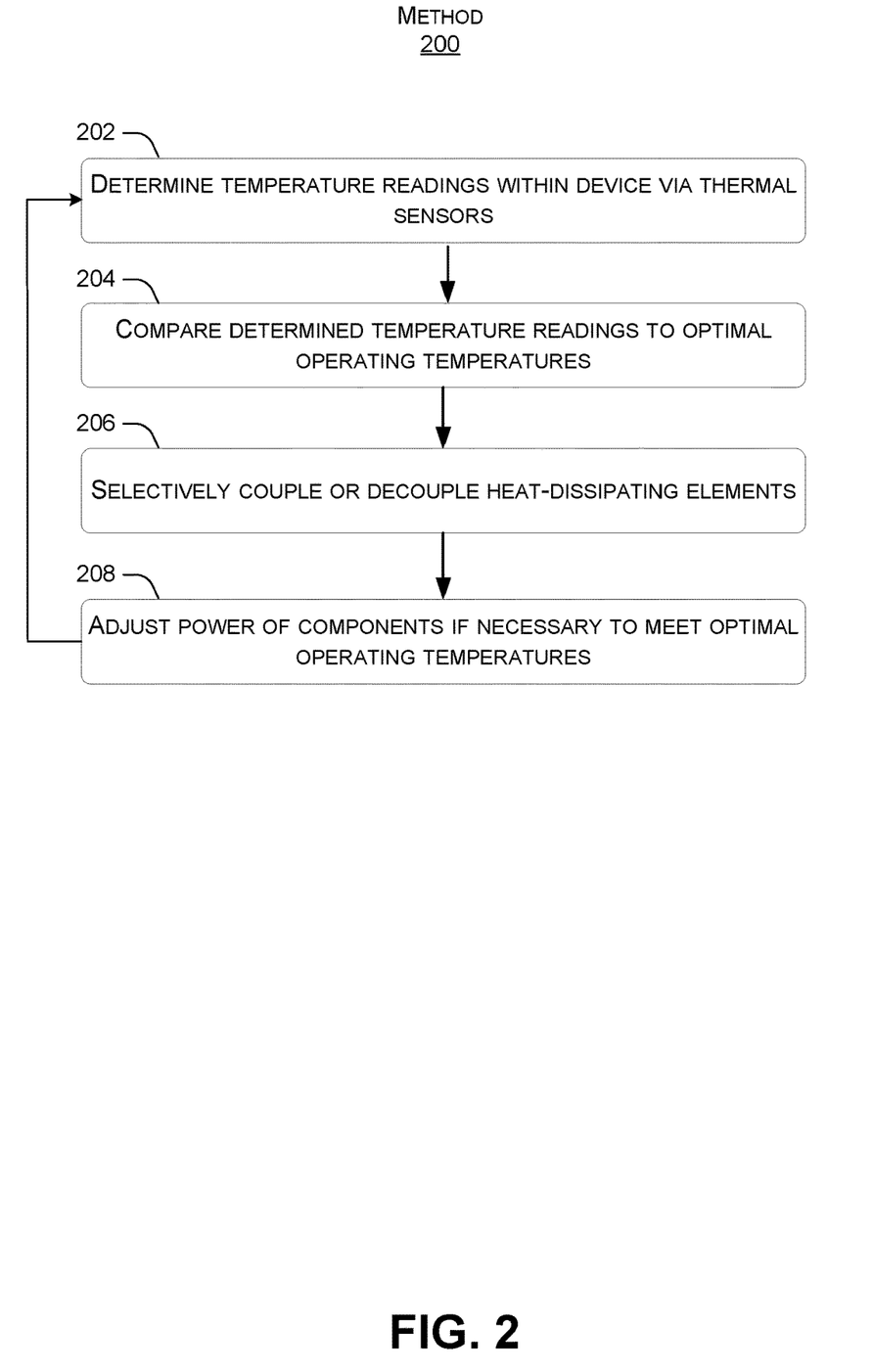
FIG. 2 illustrate an example process that is consistent with some implementations of the present concepts

The following discussion presents an overview of functionality regarding the use of heat-conductive gates for heat dissipation according to one implementation. FIG. 2 illustrates an exemplary method 200, consistent with the present concepts. Method 200 may be performed, for example, by a thermal management system that is stored and executed by processing module 108.

At block 202, the thermal management system may determine temperature readings associated with one or more components of the device. For example, temperature readings associated with touch display module 110 can be measured using a thermal sensor associated with the touch display module. Furthermore, temperature readings associated with upper beam 114A and lower beam 114B may be measured using their associated thermal sensors.

At block 204, the thermal management system may compare the determined temperature readings to optimal operating temperatures associated with each of the components of the device. Such optimal operating temperatures may be stored in, for example, a thermal lookup table stored in memory of processing module 108, and may be defined in advance by a developer of device 100.

For example, touch display module 110 may have an optimal operating temperature of 48 degrees Celsius for purposes of ensuring safe operation by a user, and when temperature readings associated with touch display module 110 exceeds this optimal operating temperature, use of the touch display may become unsafe for a user to maintain physical contact with the touch display for an extended period of time. As such, the thermal management system can determine various courses of action to lower the temperature associated with touch display module 110 such that use of the touch display module is no longer unsafe for a user.

Specifically, at block 206, the thermal management system selectively couple or decouple the heat-dissipating elements, such as upper beam 114A and lower beam 114B, by way of engagement or disengagement of heat-conductive gate(s) 116 dispersed throughout device 100, examples of which are provided in the discussion of FIGS. 1A-1E. The engagement and disengagement of heat-conducting gate(s) 116 can assist with moving heat throughout device 100 for purposes of achieving optimal system performance. In some instances, thermal sensors may measure ambient temperature associated with the device, along with both upper and lower beam temperatures, and the engagement or disengagement of heat-conductive gate(s) 116 may be based on an optimized system performance that takes each of the temperature measurements into account.

Figure 3:
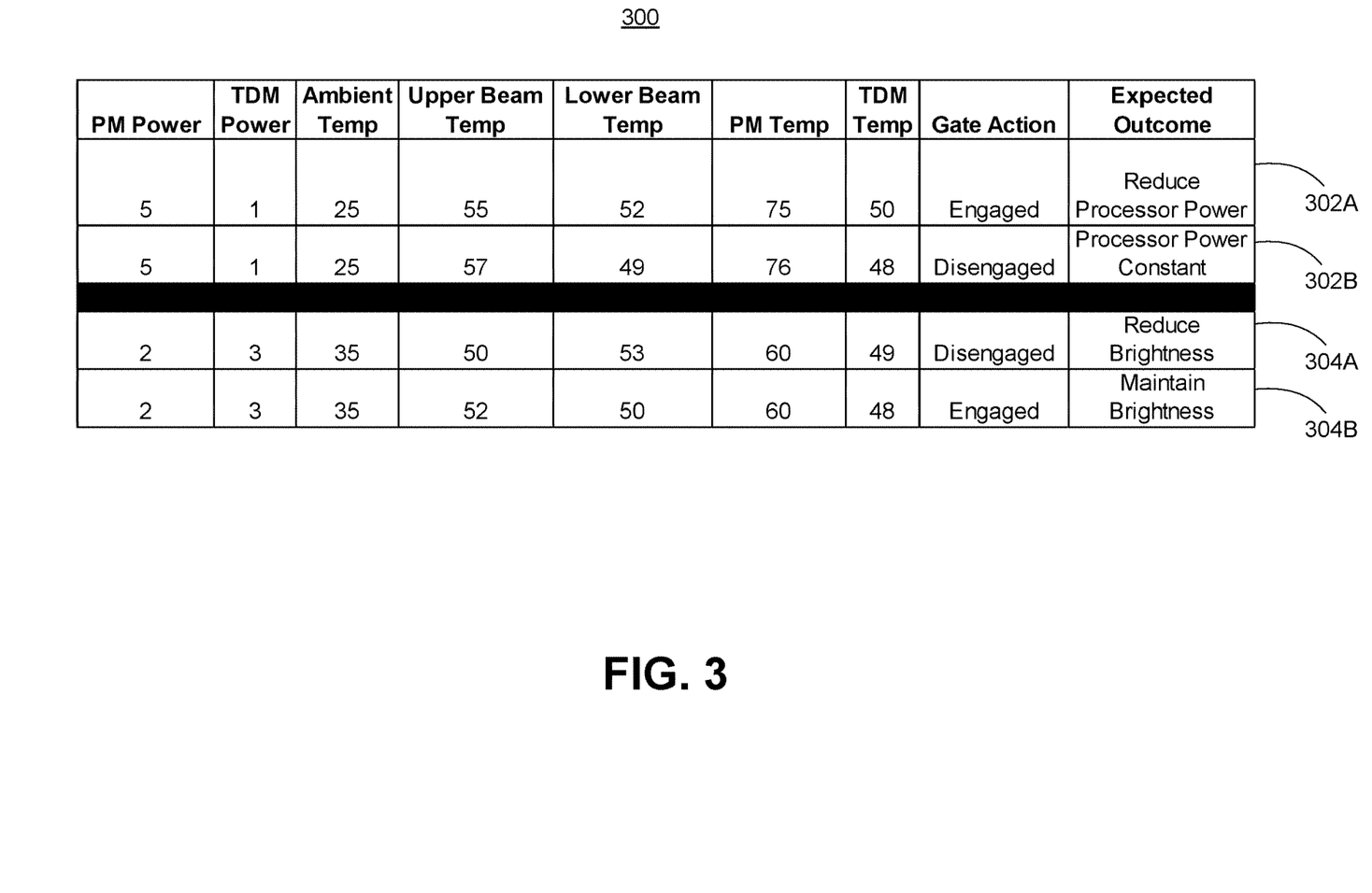
FIG. 3 illustrates an example scenario that is consistent with some implementations of the present concepts.

For example, with reference to FIG. 3, table 300 depicts example scenarios illustrating the use of temperature readings and determining an optimized system performance response. A first scenario 302A depicts processing module 108 operating at 5 watts, while touch display module 118 is operating at 1 watt. That is, in this scenario, the processing module has a high-power consumption, while the touch display module has a low-power consumption.

Given an ambient temperature of 25 degrees, an upper beam temperature of 55 degrees, and a lower beam temperature of 52 degrees, the thermal sensors associated with the processing module can report an operating temperature of 75 degrees (and therefore may have a margin to a specification temperature of 90 degrees), while the thermal sensor associated with the touch display module can report an operating temperature of 50 degrees (and therefore may exceed a specification temperature of 48 degrees). Furthermore, in scenario 302A, the heat-conducting gate in this scenario is engaged, allowing heat to flow between the upper and lower beams. In such an instance, the thermal management system can determine that the touch display module's temperature is above the optimal operating temperature, and the thermal management system's expected outcome typically in this situation is to reduce the amount of power consumption by the processing module.

However, as users typically do not want a device to artificially throttle processor performance, a second scenario 302B can instead be achieved using the adaptive mid-frame in accordance with a disclosed implementation. Scenario 302B as depicted indicates that both the processing module and the touch display module are operating at the same power levels as scenarios 302A, but because the thermal management system determined that the touch display module temperature exceeds the optimal operating temperature, the gate can instead be disengaged in order to restrict heat dispersion throughout the device.

Specifically, by disengaging the gate, the upper beam associated with the processing module can increase in temperature up to 57 degrees, while the lower beam associated with the touch display module can decrease in temperature down to 48 degrees. As a result, the processing module temperature may increase slightly, but the touch display module temperature is reduced sufficiently to achieve the optimal operating temperature according to the temperature specification. Therefore, by disengaging the gate and restricting heat conduction between the upper beam and lower beam, the processing module power and system performance can remain constant, while avoiding overheating of the touch display module.

A second example can be depicted by scenarios 304A and 304B. In scenario 304A, the processing module is operating at 2 watts (considered a low operating power level for a processing module), while the touch display module is operating at 3 watts (considered a high operating power level for a touch display module, such as running at full brightness). In this scenario, the gate is currently disengaged, and as a result, the upper beam temperature is 50 degrees (i.e., cooler due to the low-power level of the processing module), and the lower beam temperature is 53 degrees (i.e., higher due to the high-power level of the touch display module). Furthermore, the touch display module is 49 degrees, and because the touch display module temperature exceeds the optimal operating temperature, the device can seek to lower this temperature, typically achieved by reducing brightness associated with the touch display module.

However, users also do not want a device to lower screen brightness at times of heavy usage, and therefore, a second scenario 304B can instead be achieved. Scenario 304B as depicted indicates that both the processing module and the touch display module are operating at the same power levels as scenarios 304A, but because the thermal management system determined that the touch display module temperature exceeds the optimal operating temperature, the gate can instead be engaged in order to allow heat dissipation throughout the device.

Specifically, by engaging the gate, heat can flow from the lower beam to the upper beam. As noted earlier, the processing module is operating at a low-power level while the touch display module is operating at a higher operating power than the processing module, and as a result, the upper beam associated with the processing module has additional capacity to spread heat. Therefore, by engaging the gate, heat can flow from the lower beam to the upper beam, moving heat away from the touch display module, and reducing the operating temperature of the touch display module to 48 degrees. Furthermore, by dissipating heat between the upper and lower beams, the temperature of the touch display module can be reduced, without the need to reduce brightness of the touch display module.

At block 208, the thermal management system can further adjust power levels of components of the device, such as processing module 108 or touch display module 110, based at least on whether the engagement or disengagement was able to achieve the optimal operating temperatures associated with the components. For example, referring against to scenario 304B, engagement of the gate still may not be sufficient to lower the touch display module temperature to 48 degrees. In this instance, the thermal management system may specify that touch display module 110 can reduce brightness to achieve the desired optimal operating temperature. Then, the process can loop back to block 202 to continuously evaluate temperatures associated with device 100, and engage or disengage the gate as appropriate depending on the current state of the device.

It is to be appreciated that in certain implementations, the thermal management system may proactively monitor current temperatures associated with heat-generating electronic components 106, and may predict whether one or more electronic components may exceed the optimal operating temperature set for that component. For example, the thermal management system may continuously monitor the operating temperature of touch display module 110, and as the temperature approaches 48 degrees, may proactively engage or disengage the gate as appropriate in order to prevent the operating temperature of touch display module 110 from exceeding the optimal operating temperature.

Device Implementations

The present implementations can be performed in various scenarios on various devices. While device 100 as described herein is directed to a mobile device, the concepts discussed above can be used for any sort of processing device that generates heat that can adversely affect operational performance, such as various computers and computing devices including desktop computers and monitors, blade servers, cloud servers, global positioning system (GPS) units, cameras, head mounted displays, wearable smart devices, etc. Specifically, as long as a device has some computational hardware that generates heat, the device can perform heat dissipation according to the implementations set forth above. Of course, not all device implementations can be illustrated and other device implementations should be apparent to the skilled artisan from the description above and below.

The term "device", "computer," "computing device," "blade server," and or "cloud server" as used herein can mean any type of device that has some amount of hardware processing capability and/or hardware storage/memory capability. Processing capability provided by processing module 108 can include one or more hardware processors 108A (e.g., hardware processing units/cores) that can execute data in the form of computer-readable instructions to provide functionality. Computer-readable instructions and/or data can be stored on memory 108B.

Memory 108B associated with processing module 108 can be internal or external to device 100, and can include any one or more of volatile or non-volatile memory, hard drives, flash storage devices, and/or optical storage devices (e.g., CDs, DVDs, etc.), among others. As used herein, the term "computer-readable media" can include signals. In contrast, the term "computer-readable storage media" excludes signals. Computer-readable storage media includes "computer-readable storage devices." Examples of computer-readable storage devices include volatile storage media, such as RAM, and non-volatile storage media, such as hard drives, optical discs, and flash memory, among others.

In some cases, processor 108A may be a general-purpose hardware processor. In other cases, processing module 108 may utilize a SOC type design. In SOC design implementations, functionality provided by the device can be integrated on a single SOC or multiple coupled SOCs. One or more associated processors can be configured to coordinate with shared resources, such as memory, storage, etc., and/or one or more dedicated resources, such as hardware blocks configured to perform certain specific functionality. Thus, the term "processor," "hardware processor" or "hardware processing unit" as used herein can also refer to CPUs, GPUs, controllers, microcontrollers, processor cores, or other types of processing devices suitable for implementation both in conventional computing architectures as well as SOC designs.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

In some configurations, any of the modules/code discussed herein can be implemented in software, hardware, and/or firmware. In any case, the modules/code can be provided during manufacture of the device or by an intermediary that prepares the device for sale to the end user. In other instances, the end user may install these modules/code later, such as by downloading executable code and installing the executable code on the corresponding device.

Also note that device 100 generally can have input and/or output functionality. For example, device 100 can have various input mechanisms such as keyboards, mice, touchpads, voice recognition, gesture recognition (e.g., using depth cameras such as stereoscopic or time-of-flight camera systems, infrared camera systems, RGB camera systems or using accelerometers/gyroscopes, facial recognition, etc.). Device 100 can also have various output mechanisms such as printers, monitors, etc.

Also note that the devices described herein can function in a stand-alone or cooperative manner to implement the described techniques. For example, the methods described herein can be performed on a single device, such as device 100, and/or distributed across multiple computing devices that communicate over one or more local area networks (LANs), the Internet, and the like. For example, a central thermal management system can be provided on a cloud server, where thermal management of networked servers can be handled by the central thermal management system.

ADDITIONAL EXAMPLES

Various device examples are described above. Additional examples are described below. One example includes a device comprising a processing unit, a touch-sensitive display surface, a first heat-dissipating element coupled to the processing unit, a second heat-dissipating element coupled to the touch-sensitive display surface, and a heat-conducting element selectively coupled between the first heat-dissipating element and the second heat-dissipating element, the heat-conducting element can be positioned to allow or restrict heat to flow between the first heat-dissipating element and second dissipating element based at least on temperature readings associated with the processing unit and the touch-sensitive display surface.

Another example can include any of the above and/or below examples where the heat-conducting element can be positioned to allow or restrict heat to flow by use of a positioning element.

Another example can include any of the above and/or below examples where the positioning element is an electromagnet, a hinge, a motor, a sliding mechanism, or a pump.

Another example can include any of the above and/or below examples where the heat-conducting element is a metallic bar that is positioned to contact the first heat-dissipating element and the second heat-dissipating element by engaging a magnet that moves the metallic bar.

Another example can include any of the above and/or below examples where the heat-conducting element is a chamber that can be filled with a heat-conducting fluid from the pump to allow heat to flow between the first heat-dissipating element and the second heat-dissipating element.

Another example can include any of the above and/or below examples where the temperature readings are compared to optimal operating temperatures.

Another example can include any of the above and/or below examples where the heat-conducting element is positioned to allow heat to flow between the first heat-dissipating element and the second heat-dissipating element when the temperature reading associated with the touch-sensitive display surface exceeds the optimal operating temperature, and the touch-sensitive display surface has a higher operating power than the processing unit.

Another example can include any of the above and/or below examples where the device further comprises a third heat-dissipating element, the third heat-dissipating element selectively coupled to one or more of the first heat-dissipating element or the second heat-dissipating using at least a second heat-conducting element.

Another example includes a device comprising a plurality of heat-generating electronic components, a heat-conducting system dispersed throughout the device to carry heat away from the heat-generating electronic components, and one or more gates dispersed throughout the heat-conducting system that can be selectively engaged to allow heat conduction between elements of the heat-conducting system, or disengaged to restrict heat conduction between the elements of the heat-conduction system, based at least on temperature readings associated with the heat-generating electronic components.

Another example can include any of the above and/or below examples where the gates comprise a heat-conducting element and a positioning element.

Another example can include any of the above and/or below examples where the heat-conducting element is a solid conducting material that is capable of conducting heat.

Another example can include any of the above and/or below examples where the solid conducting material is metal or graphite.

Another example can include any of the above and/or below examples where the positioning element is an electromagnet, a hinge, a motor, a sliding mechanism, or a pump.

Another example can include any of the above and/or below examples where the temperature readings are compared to optimal operating temperatures associated with the heat-generating electronic components.

Another example can include any of the above and/or below examples where the gates are selectively engaged or disengaged upon determining that the temperature readings exceed the optimal operating temperatures.

Another example can include any of the above and/or below examples where the gate is engaged when a temperature reading associated with a first heat-generating electronic component exceeds the optimal operating temperature for the first heat-generating electronic component, and the first heat-generating electronic component has a higher operating power than a second heat-generating electronic component.

Another example includes a method comprising determining temperature readings associated with at least one of a touch-sensitive display or a processing unit, comparing the determined temperature readings to an optimal operating temperature, and selectively coupling or decoupling a first heat-dissipating element associated with the touch-sensitive display from a second heat-dissipating element associated with the processing unit based at least on whether the determined temperature exceeds the optimal operating temperature.

Another example can include any of the above and/or below examples where the first heat-dissipating element is coupled or decoupled from the second heat-dissipating element by selectively engaging or disengaging a heat-conducting gate that is coupled between the first heat-dissipating element and the second heat-dissipating element.

Another example can include any of the above and/or below examples where the heat-conducting gate comprises a heat-conducting element and a positioning element.

Another example can include any of the above and/or below examples where the method further comprises determining whether the selective coupling or decoupling of the first heat-dissipating element from the second heat-dissipating element lowered the temperature reading associated with the touch-sensitive display or the processing unit and adjusting power of at least one of the touch-sensitive display or the processing unit upon determining that the temperature reading was not lowered to the optimal operating temperature.

CONCLUSION

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims and other features and acts that would be recognized by one skilled in the art are intended to be within the scope of the claims.

The invention claimed is:

1. A device comprising:
   a touch-sensitive display surface configured to emit images;
   a touch display module configured to display the images through the touch-sensitive display surface, the touch display module having a first defined maximum operating temperature;
   a first heat-dissipating element positioned over the touch display module in heat receiving relation with the touch display module;
   an image producing module configured to generate the images and positioned over the first heat-dissipating element in heat receiving relation with the first heat-dissipating element;
   a second heat-dissipating element positioned over the image producing module and thermally insulated from the image producing module;
   a processor unit positioned over the second heat-dissipating element in heat receiving relation to the second heat-dissipating element, the processor unit having a second defined maximum operating temperature; and
   a selectively controllable heat-conducting gate thermally coupled between the first heat-dissipating element and the second heat-dissipating element and configured to thermally couple the first heat-dissipating element and the second heat-dissipating element when the touch display module is at the first defined maximum operating temperature and the processor unit is below the second defined maximum operating temperature and to thermally uncouple the first heat-dissipating element and the second heat-dissipating element when the touch display module is at the first defined maximum operating temperature and the processor unit is at the second defined maximum operating temperature.

2. The device of claim 1, wherein the selectively controllable heat-conducting gate can be positioned to allow or restrict heat to flow by use of a positioning element.

3. The device of claim 2, wherein the positioning element is an electromagnet, a hinge, a motor, a sliding mechanism, or a pump.

4. The device of claim 3, wherein the positioning element is a metallic bar that is positioned to contact the first heat-dissipating element and the second heat-dissipating element by engaging a magnet that moves the metallic bar.

5. The device of claim 3, wherein the selectively controllable heat-conducting gate is a chamber that can be filled with a heat-conducting fluid from the pump to allow heat to flow between the first heat-dissipating element and the second heat-dissipating element.

6. The device of claim 1, further comprising a first temperature sensor to sense a temperature of the touch display module.

7. The device of claim 6, wherein the first temperature sensor is positioned between the touch display module and the touch-sensitive display surface.

8. The device of claim 1, further comprising a third heat-dissipating element, the third heat-dissipating element selectively coupled to one or more of the first heat-dissipating element or the second heat-dissipating using at least a second selectively controllable heat-conducting gate.

9. A device comprising:
   a touch-sensitive display configured to emit images;
   a first heat generating electronic component configured to power the touch-sensitive display and having a first defined maximum operating temperature;

a first heat-dissipating element positioned over the first heat generating electronic component in heat receiving relation with the first heat generating electronic component;

a second heat generating electronic component positioned over the first heat-dissipating element in heat receiving relation with the first heat-dissipating element;

a second heat-dissipating element positioned over the second heat generating electronic component;

a third heat generating electronic component positioned over the second heat-dissipating element in heat receiving relation to the second heat-dissipating element, the third heat generating electronic component having a second defined maximum operating temperature; and, a selectively controllable heat-conducting gate thermally coupled between the first heat-dissipating element and the second heat-dissipating element and configured to thermally couple the first heat-dissipating element and the second heat-dissipating element when the first heat generating electronic component is at the first defined maximum operating temperature and the third heat generating electronic component is below the second defined maximum operating temperature and to thermally uncouple the first heat-dissipating element and the second heat-dissipating element when the first heat generating electronic component is at the first defined maximum operating temperature and the third heat generating electronic component is at the second defined maximum operating temperature.

10. The device of claim 9, wherein the selectively controllable heat-conducting gate comprises a heat-conducting element and a positioning element.

11. The device of claim 10, wherein the heat-conducting element is a solid conducting material that is capable of conducting heat.

12. The device of claim 11, wherein the solid conducting material is metal or graphite.

13. The device of claim 10, wherein the positioning element is an electromagnet, a hinge, a motor, a sliding mechanism, or a pump.

14. The device of claim 9, further comprising a first temperature sensor positioned proximate to the first heat generating electronic component and a second temperature sensor positioned proximate to the second heat generating electronic component.

15. The device of claim 14, further comprising a third temperature sensor positioned proximate to the third heat generating electronic component.

16. The device of claim 9, wherein the first heat generating electronic component includes the touch-sensitive display.

17. A device comprising:

a touch-sensitive display configured to emit images;

a first heat generating electronic component configured to power the touch-sensitive display and having a first defined maximum operating temperature;

a first heat-dissipating element positioned over the first heat generating electronic component in heat receiving relation with the first heat generating electronic component;

a second heat generating electronic component positioned over the first heat-dissipating element in heat receiving relation with the first heat-dissipating element;

a second heat-dissipating element;

a third heat generating electronic component positioned over the second heat-dissipating element in heat receiving relation to the second heat-dissipating element, the third heat generating electronic component having a second defined maximum operating temperature; and, a selectively controllable heat-conducting gate thermally coupled between the first heat-dissipating element and the second heat-dissipating element and configured to thermally couple the first heat-dissipating element and the second heat-dissipating element when the first heat generating electronic component is at the first defined maximum operating temperature and the third heat generating electronic component is below the second defined maximum operating temperature and to thermally uncouple the first heat-dissipating element and the second heat-dissipating element when the first heat generating electronic component is at the first defined maximum operating temperature and the third heat generating electronic component is at the second defined maximum operating temperature.

* * * * *